United States Patent
Goishi

(10) Patent No.: US 7,539,592 B2
(45) Date of Patent: May 26, 2009

(54) TEST APPARATUS AND ELECTRONIC DEVICE

(75) Inventor: Masaru Goishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/690,141

(22) Filed: Mar. 23, 2007

(65) Prior Publication Data

US 2008/0234965 A1      Sep. 25, 2008

(51) Int. Cl.
G01R 31/00    (2006.01)
G01M 19/00    (2006.01)

(52) U.S. Cl. .................................... 702/125
(58) Field of Classification Search .................. 702/125
See application file for complete search history.

(56) References Cited

U.S. PATENT DOCUMENTS

| | | | | |
|---|---|---|---|---|
| 5,566,188 | A * | 10/1996 | Robbins et al. | 714/744 |
| 6,058,057 | A * | 5/2000 | Ochiai et al. | 365/201 |
| 7,228,248 | B2 * | 6/2007 | Ochi et al. | 702/108 |
| 2006/0284662 | A1 * | 12/2006 | Suda et al. | 327/261 |
| 2008/0012576 | A1 * | 1/2008 | Sato et al. | 324/617 |
| 2008/0114563 | A1 * | 5/2008 | Kappauf et al. | 702/124 |
| 2008/0120059 | A1 * | 5/2008 | Awaji et al. | 702/125 |
| 2008/0258714 | A1 * | 10/2008 | Suda et al. | 324/158.1 |

FOREIGN PATENT DOCUMENTS

| | | |
|---|---|---|
| JP | 61-047573 | 3/1986 |
| JP | 08201483 | 8/1996 |
| JP | 2003204252 | 7/2003 |

OTHER PUBLICATIONS

JP-08201483 Computer Translation, Suda, "Timing Generator", Aug. 1996, pp. 1-11.*

* cited by examiner

*Primary Examiner*—Michael P. Nghiem
*Assistant Examiner*—Cindy H Khuu
(74) *Attorney, Agent, or Firm*—Osha • Liang LLP

(57) ABSTRACT

A test apparatus for testing a device under test is provided. The test apparatus includes: a timing data output section for outputting timing data to define at least one of a timing of modifying a test signal provided to the device under test and a timing of acquiring an output signal outputted by the device under test; a variable delay circuit for delaying a reference clock pulse of the test apparatus by a delay amount corresponding to designated delay data so as to generate a timing signal having a transition point corresponding to the at least one timing; and a range modification section for modifying the modification amount of the delay data when the timing data are changed by one unit in response to a change of a setting range within which the at least one timing is set.

7 Claims, 3 Drawing Sheets

TEST APPARATUS AND ELECTRONIC DEVICE

BACKGROUND

1. Technical Field

The present invention relates to a test apparatus and an electronic device. More specifically, the present invention relates to a test apparatus and an electronic device enabling low-speed and high-speed devices or a device having both low-speed and high-speed sections to be tested with a single test apparatus.

2. Related Art

A test apparatuses for testing a device under test (DUT) receive output signals from the output terminals of the DUT in response to test signals inputted to the input terminals. Then, the test apparatus compares the output signals with an expected value that is expected when the test signals are inputted to the DUT, so that the functions of DUT are tested. Here, the timings for inputting the test signals to each terminal of the DUT are designated by timing signals generated by a timing generator. Also, the timings for acquiring the output signals from the DUT are designated by strobe signals generated by the timing generator.

The timing and strobe signals are generated by a variable delay circuit based on timing data recorded in a timing memory of the timing generator. Japanese Patent Application Publication No. 61-47573, for example, discloses that upper data of the delay data set by a delay setting device are inputted to a coarse delay device so as to delay pulses from a period generator. Then, the pulses delayed by the coarse delay device along with lower data of the delay data are inputted to a fine delay circuit so as to output pulses delayed based on the delay data.

SUMMARY

Actually, there are situations where a low-speed device having a response frequency on the order of kilohertz (kHz) and a high-speed device having a response frequency on the order of gigahertz (GHz) are preferably to be tested with a single test apparatus. Also, there are situations where a device having both a low-speed section having a response frequency on the order of kHz and a high-speed section having a response frequency on the order of GHz is preferably to be tested.

However, when such low-speed and high-speed devices are tested with a single test apparatus, or when the device having both low-speed and high-speed sections is tested, the configurable range for the timing or strobe signals are required to be broader. For example, a low-speed device having a response frequency of about 1 kHz, which corresponds to a response period of 1 msec, should have a resolution of about 0.1% thereof, i.e., 1 μsec. Besides, the test period should be set as about one thousand times of the response period, i.e., 1 sec. Similarly, in the case of a high-speed device having a response frequency of about 1 GHz, it is required to have both a resolution of about 0.1% of the response period of 1 nsec, i.e., 1 psec and a test period of about one thousand times of the response period, i.e., 1 μsec.

Thus, the timings should be set in a dynamic range covering from 1 msec to 1 psec to test a low-speed device having a response frequency on the order of kHz and a high-speed device having a response frequency on the order of GHz with a single test apparatus. Such a broader setting range is equivalent to about thirty bits in a binary form. If a circuit that has a dynamic range of as many as thirty bits for generating timing signals is to be implemented, the circuit would be too large in size. This is not preferred.

Therefore, one advantage of the present invention is to provide a test apparatus and an electronic device that can solve the above described problems. This advantage is achieved by combining the features recited in independent claims. Then, dependent claims define further effective examples according to the present invention.

Thus, one aspect of the present invention provides a test apparatus for testing a device under test. The test apparatus includes: a timing data output section for outputting timing data to define at least one of a timing of modifying a test signal provided to the device under test and a timing of acquiring an output signal outputted by the device under test; a variable delay circuit for delaying a reference clock pulse of the test apparatus by a delay amount corresponding to designated delay data so as to generate a timing signal having a transition point corresponding to the at least one timing; and a range modification section for modifying the change amount of the delay data when the timing data are changed by one unit based on the change of a setting range within which the at least one timing is set.

Here, all necessary features of the present invention are not listed in the summary of the invention. The sub-combinations of the features may become the invention.

DESCRIPTION OF EXEMPLARY EMBODIMENTS

The invention will now be described based on preferred embodiments, which are not intended to limit the scope of the invention, but to exemplify the invention. All of the features and the combinations thereof described in the embodiments are not necessarily essential to the invention.

Figure 1:
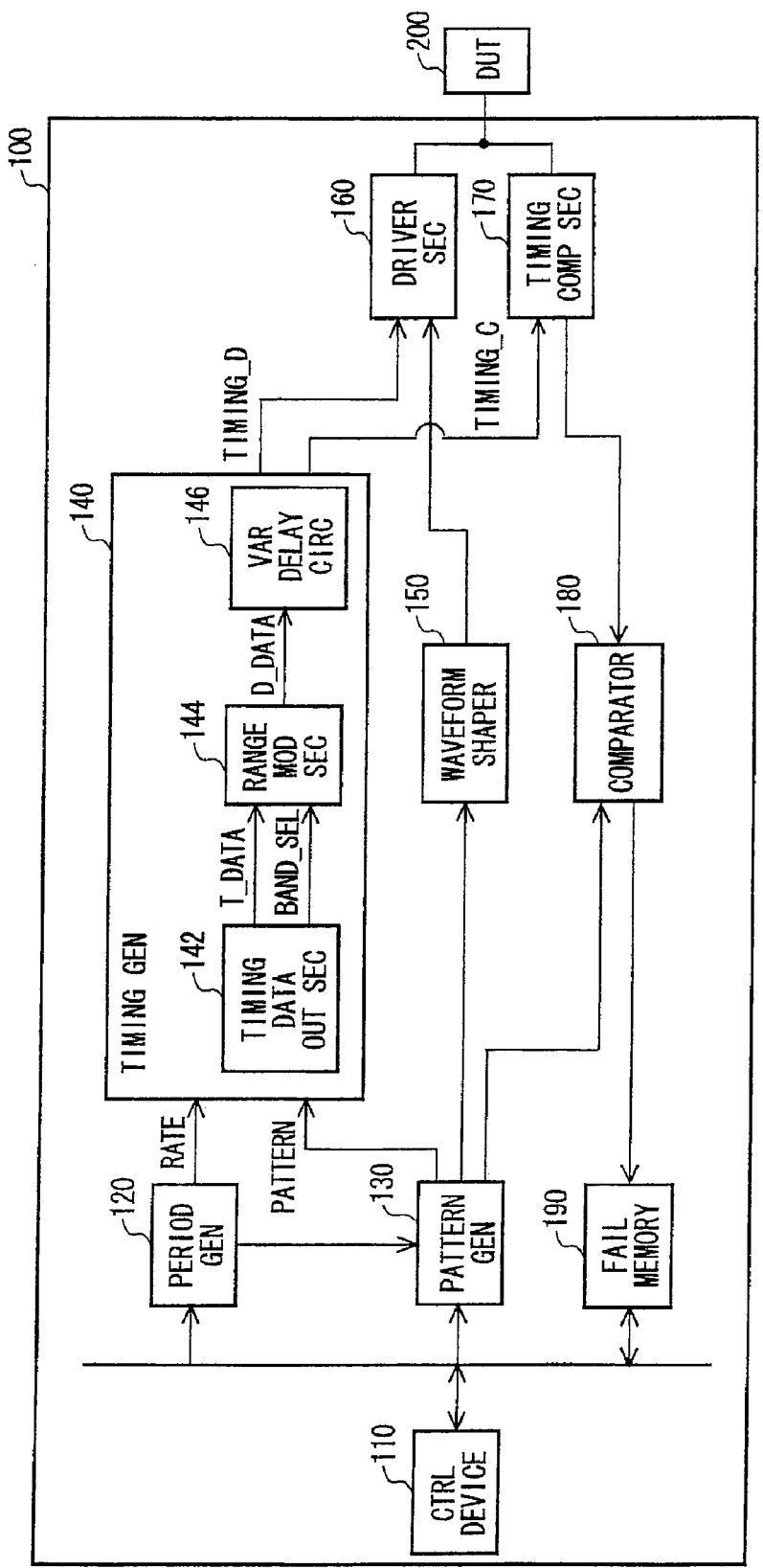
FIG. 1 shows one example of a test apparatus along with a DUT according to an embodiment of the present invention.

FIG. 1 shows a configuration of a test apparatus 100 along with a DUT 200 according to one embodiment of the present invention. The test apparatus 100 tests one or more devices under test (DUTs) 200. Examples of the DUT 200 include, but are not limited to, a memory LSI such as a dynamic random access memory (DRAM) or a flash memory, a logic IC, a logic LSI and the like.

The test apparatus 100 includes a control device 110, a period generator 120, a pattern generator 130, a timing generator 140, waveform shaper 150, a driver section 160, a timing comparing section 170, a comparator 180 and a fail memory 190. The control device 110, which may include a computer system, controls the test for the DUT 200 based on a certain program.

The period generator 120 generates a reference clock CLK for operating each section in the test apparatus 100 during the test for the DUT 200. The period generator 120 also defines a period of each test cycle included in the test. The test periods may be defined so that each test period has the same length as each other, or has a different length from each other.

The pattern generator 130 generates pattern data PATTERN, which include at least one of a test signal pattern provided to a terminal of the DUT 200, i.e., a test pattern, and an output signal pattern expected in an output of the DUT 200 when the test signal is provided to the DUT 200, i.e., an expected value pattern. The pattern data PATTERN include timing information TS for generating a timing signal TIMING_D and a strobe signal TIMING_C that may represent timings respectively for generating the test signal and for acquiring the output signal. The pattern data PATTERN also include setting range designation data that are used in a timing data output section of the timing generator 140, which will be described below.

The pattern generator 130 generates pattern data PATTERN at every test period defined by the period generator 120. The pattern generator 130 provides the timing generator 140 with the generated pattern data PATTERN. The pattern generator 130 also provides the waveform shaper 150 with data relating at least to the test pattern included in the pattern data PATTERN. The pattern generator 130 further provides the comparator 180 with data relating at least to the expected value pattern included in the pattern data PATTERN. Examples of the pattern generator 130 include, but are not limited to, a sequential pattern generator for generating corresponding test patterns based on instruction sequences of the test programs, and an algorithmic pattern generator for generating test patterns based on predetermined algorithms.

The timing generator 140 outputs the timing signal TIMING_D and the strobe signal TIMING_C. The timing signal TIMING_D represents a timing at which the test signal provided to the DUT 200 is modified into either high-level or low-level, while the strobe signal TIMING_C represents a timing at which the output signal of the DUT 200 is acquired. The timing signal TIMING_D and the strobe signal TIMING_C are generated by delaying the reference clock CLK based on the timing information TS designated by the pattern generator 130 and/or preset timing information in the timing generator 140. The timing generator 140 provides the driver section 160 and the timing comparing section 170 with the generated timing signal TIMING_D and strobe signal TIMING_C, respectively.

The timing generator 140 includes a timing data output section 142, a range modification section 144 and a variable delay circuit 146. The timing data output section 142 outputs the timing data T_DATA based on the timing information TS acquired from the pattern generator 130 and/or preset timing information. The timing data output section 142 outputs the timing data T_DATA for defining at least one of a modification timing of the test signal provided to the DUT 200 and an acquisition timing of the output signal outputted from the DUT 200. The timing data output section 142 also outputs a band selection signal BAND_SEL used as the setting range designation data by a range modification section 144 that will be described below.

The range modification section 144 acquires the timing data T_DATA and the band selection signal BAND_SEL from the timing data output section 142 so as to generate delay data D_DATA. The generated delay data D_DATA are outputted to the variable delay circuit 146. When the timing data T_DATA are modified by one unit based on the band selection signal BAND_SEL, the range modification section 144 modifies a modification amount of the delay data D_DATA. For example, in the case that the band selection signal BAND_SEL is selected to designate the modification amount as a factor of one, the delay data D_DATA are changed by one unit when the timing data T_DATA are changed by one unit. Also, in the case that the band selection signal BAND_SEL is selected to designate the modification amount as a factor of 1024, the delay data D_DATA are changed by 1024 units when the timing data T_DATA are changed by one unit.

The variable delay circuit 146 delays the pulses of the reference clock CLK by a delay amount based on the delay data D_DATA so as to generate the timing signal TIMING_D or the strobe signal TIMING_C. The variable delay circuit 146 includes, but is not limited to, a coarse delay circuit for delaying the pulses of the reference clock CLK by a coarse delay time, and a fine delay circuit for delaying the coarse-delayed pulses by a fine delay time. The coarse delay circuit may delay such pulses, for example, by a coarse delay time equivalent to an integer multiple period of the reference clock CLK. The fine delay circuit may delay such pulses, for example, by a fine delay time less than one period of the reference clock CLK.

The waveform shaper 150 shapes the test pattern waveforms inputted from the pattern generator 130. The waveform shaper 150 provides the driver section 160 with a waveform-shaped signal of the test pattern.

The driver section 160 drives the waveform-shaped signal of the test pattern inputted from the waveform shaper 150 into a logic value H or L at a timing designated by the timing signal TIMING_D. Also, the driver section 160 converts the driven signal for the logic value H or L into a designated voltage amplitude level. The converted signal is outputted as a test signal to the terminal of the DUT 200.

The timing comparing section 170 acquires the output signal outputted from the terminal of the DUT 200 at a timing designated by the strobe signal TIMING_C. Subsequently, the timing comparing section 170 provides the comparator 180 with the acquired results. The timing comparing section 170, for example, compares the output signal voltage of the DUT 200 with the level voltages ViH and ViL that represent the logic values H and L respectively, so as to output logic values of the output signal based on the comparison results.

The comparator 180 compares the output signal logic value of the DUT 200, which the timing comparing section 170 acquires at the timing designated by the strobe signal TIMING_C, with the expected value patterns of the output signal inputted from the pattern generator 130. The comparator 180 may include a logic comparator, which outputs to a fail memory 190 the comparison results representing the consistency/inconsistency with the expected value and the like. The fail memory 190 stores the comparison results from the comparator 180.

As described above, the timing generator 140 of the present embodiment includes the range modification section 144, which modifies the modification amount of the delay data D_DATA when the timing data T_DATA are changed by one unit according to the band selection signal BAND_SEL. Performing selection on the band selection signal BAND_SEL may enlarge the setting range for the timing signal TIMING_D and the like, which are generated by the variable delay circuit 146 based on the delay data D_DATA.

Figure 2:
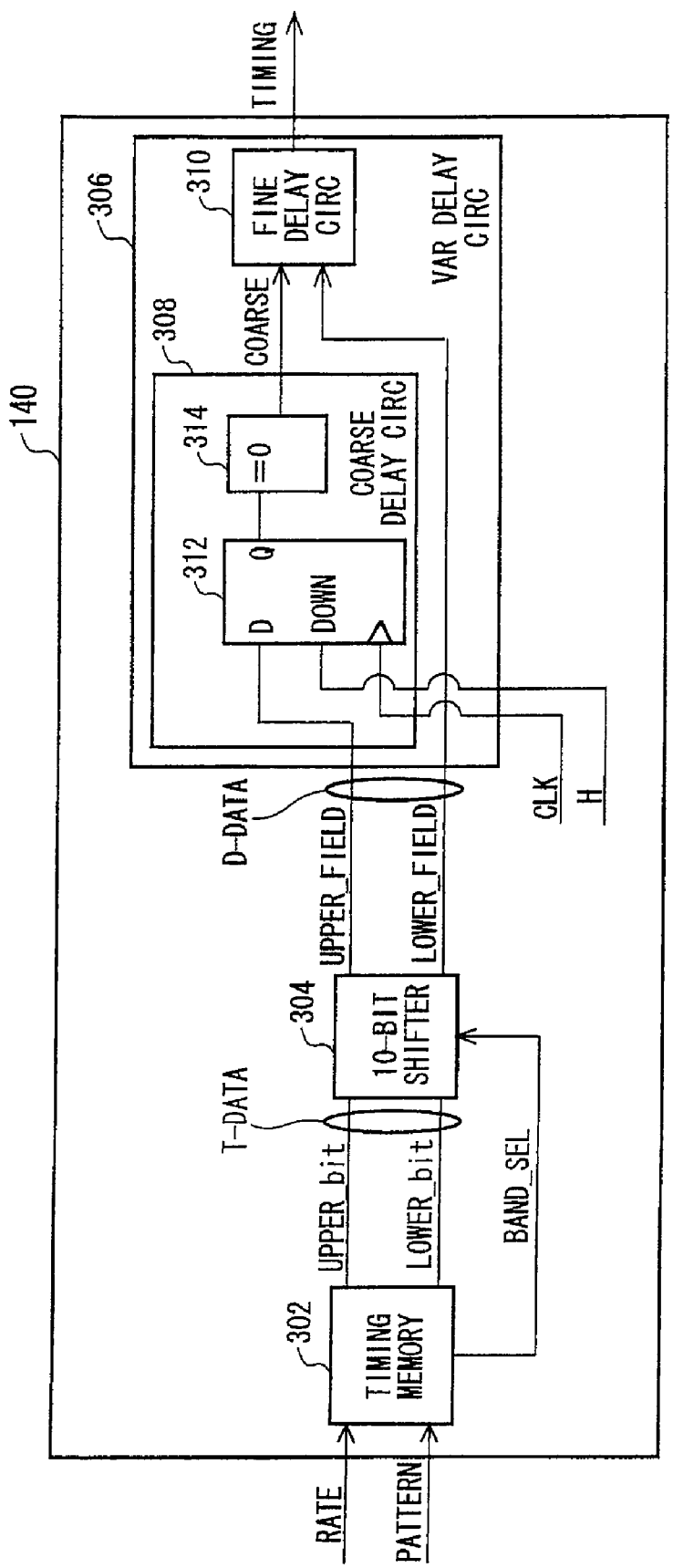
FIG. 2 shows one example of a timing generation circuit according to an embodiment of the present invention.

FIG. 2 shows one example of the timing generator 140. The timing generator 140 includes a timing memory 302, a ten-bit shifter 304 and a variable delay circuit 306.

The timing memory 302 may represent an example of the timing data output section 142. The timing memory 302 receives a test period signal RATE from the period generator 120 and pattern data PATTERN from the pattern generator 130 so as to output the upper bits UPPER_bit and the lower bits LOWER_bit of the timing data T_DATA as well as the band selection signal BAND_SEL. The timing memory 302 outputs the timing data T_DATA such as twenty-bit binary data.

The ten-bit shifter 304 may represent an example of the range modification section 144. The ten-bit shifter 304 either ten-bit shifts or not the timing data T_DATA based on the band selection signal BAND_SEL received from the timing memory 302. The ten-bit shifter 304 outputs the data either ten-bit shifted or not based on the selection, to the variable delay circuit 306 as the delay data D_DATA. The data either ten-bit shifted or not are stored into the upper field UPPER_FIELD or the lower field LOWER_FIELD of the delay data D_DATA. The ten-bit shifter 304 outputs the delay data D_DATA such as thirty-bit binary data.

The variable delay circuit 306 includes a coarse delay circuit 308 and a fine delay circuit 310. The coarse delay circuit 308 includes a down counter 312 to which the values in the upper field UPPER_FIELD of the delay data D_DATA are inputted at the input D thereof, and a logic circuit 314 for outputting the logic value H when a zero value is inputted thereto. The output Q of the down counter 312 is inputted to the logic circuit 314. The logic value H is inputted to the input DOWN of the down counter 312. Further, the reference clock CLK is inputted to the trigger input of the down counter 312.

The coarse delay circuit 308 counts the reference clock CLK until a value in the upper field UPPER_FIELD of the delay data D_DATA becomes zero. Then, when the value has become zero, the coarse delay circuit 308 outputs the logic value H as a coarse delay signal COARSE. Thus, the coarse delay circuit 308 generates the coarse delay signal COARSE in which the pulses are delayed by a coarse delay time Tc, i.e., the time resulting from multiplying the period of the reference clock CLK by a number designated in the upper field UPPER_FIELD of the delay data D_DATA.

The fine delay circuit 310 receives the coarse delay signal COARSE from the coarse delay circuit 308 and a value in the lower field LOWER_FIELD of the delay data D_DATA. Then, a fine delay time is added to the pulses of the coarse delay signals COARSE so as to obtain pulses for generating a timing signal TIMING_D or a strobe signals TIMING_C. It should be noted that the term "timing signals TIMING" shown in FIG. 2 is a generic term for representing both the timing signals TIMING_D and the strobe signals TIMING_C. The fine delay circuit 310 may delay such coarse delay signals COARSE, for example, by a fine delay time less than one period of the reference clock CLK.

Figure 3:
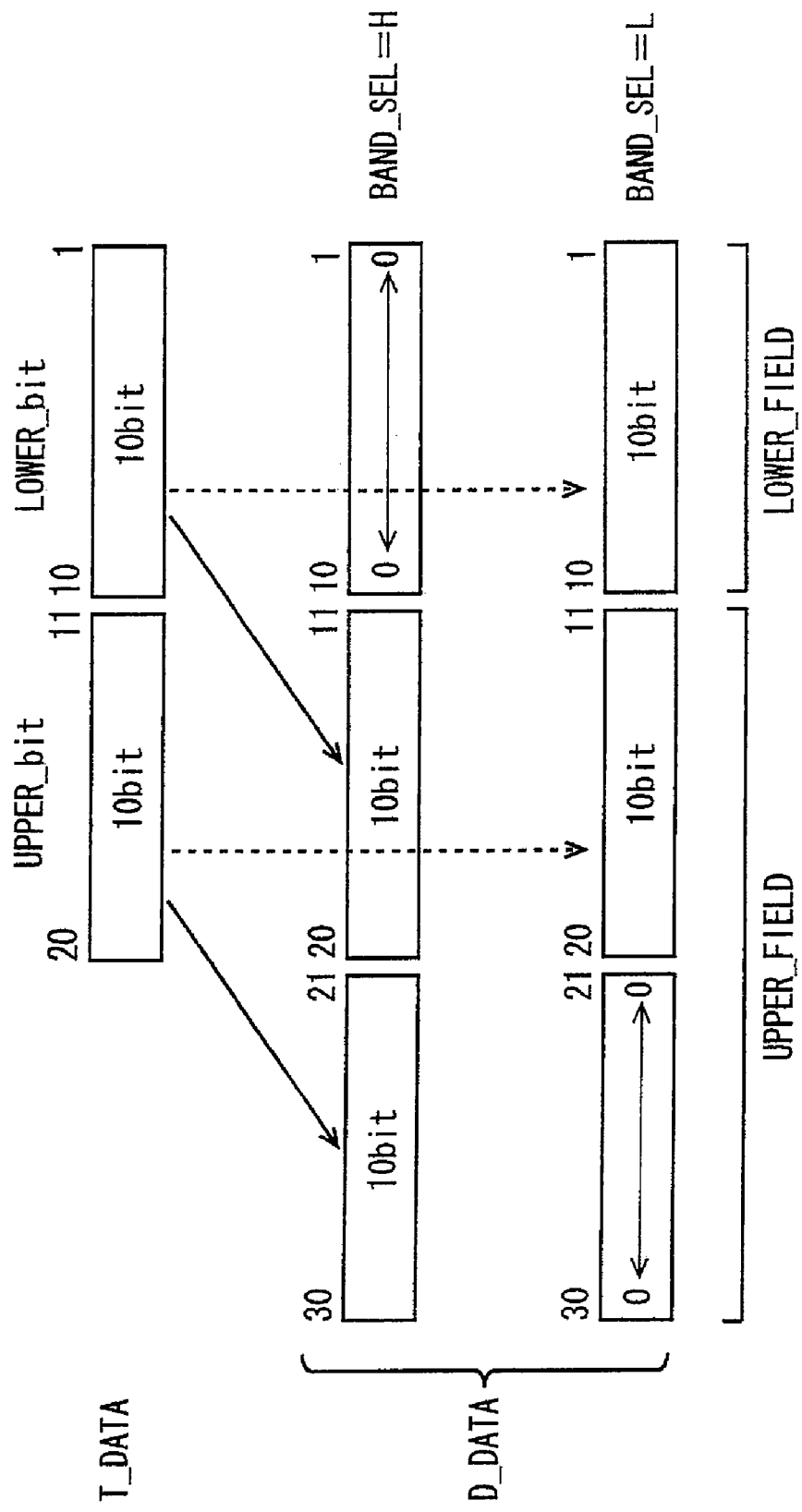
FIG. 3 shows an operation of a ten-bit shifter according to an embodiment of the present invention.

FIG. 3 shows one example of the operation of the timing generator 140 shown in FIG. 2. Twenty-bit timing data T_DATA are provided by the timing memory 302. The upper bits UPPER_bit (i.e., ten bits) and the lower bits LOWER_bit (i.e., ten bits) of the timing data T_DATA are respectively allocated to the upper field UPPER_FIELD (i.e., twenty bits) and the lower field LOWER_FIELD (i.e., ten bits) of the delay data D_DATA based on the band selection signal BAND_SEL.

In the case that the band selection signal BAND_SEL lies in the logic value H, the upper bits UPPER_bit (i.e., ten bits) and the lower bits LOWER_bit (i.e., ten bits) of the timing data T_DATA are inputted into the upper field UPPER_FIELD (i.e., twenty bits) of the delay data D_DATA. On the other hand, zero is inputted to each bit in the lower field LOWER_FIELD (i.e., ten bits) of the delay data D_DATA.

In the case that the band selection signal BAND_SEL lies in the logic value L, the upper bits UPPER_bit (i.e., ten bits) of the timing data T_DATA are inputted into the lower ten bits of the upper field UPPER_FIELD (i.e., twenty bits) of the delay data D_DATA. The lower bits LOWER_bit (i.e., ten bits) of the timing data T_DATA are inputted into the lower field LOWER_FIELD (i.e., ten bits) of the delay data D_DATA. On the other hand, zero is inputted into the upper ten bits of the upper field UPPER_FIELD (i.e., twenty bits) of the delay data D_DATA.

As described above, the timing data T_DATA are converted into the delay data D_DATA by the range modification section 144. Then, the timing signal TIMING_D and the like are generated based on the delay data D_DATA. In the above-described case, the setting range of the timing signal TIMING_D and the like is modified into a range one to 1024 times the range that can be designated by the timing data T_DATA by performing a selection on the band selection signal BAND_SEL.

Thus, in the case that the band selection signal BAND_SEL lies in the logic value L, it is possible to set timings within a time calculated from multiplying the binary value range (i.e., zero to 1023), which can be designated by the upper ten bits of the timing data T_DATA, by the period of the reference clock CLK. It should be noted that a desired setting accuracy is maintained in the above-described case, because the fine delay time less than one period of the reference clock CLK is designated by the lower ten bits of the timing data T_DATA.

Also, in the case that the band selection signal BAND_SEL lies in the logic value H, it is possible to set timings within a time resulting from multiplying the binary value range (i.e., zero to 1048575), which can be designated by twenty bits of the upper ten and lower ten bits of the timing data T_DATA, by the period of the reference clock CLK. It should be noted that no delay is performed by the fine delay circuit 310, because a desired setting accuracy is maintained by the coarse delay circuit 308.

As described above, according to the test apparatus of the present embodiment, it is possible to enlarge the setting range of the timing signal TIMING_D or the strobe signals TIMING_C based on the selection of the band selection signals BAND_SEL. As a result, a timing setting range equivalent to thirty bits, for example, can be ensured in a desired setting accuracy by twenty-bit timing data T_DATA. Therefore, both a low-speed device having a response frequency on the order of kHz and a high-speed device having a response frequency on the order of GHz, for example, are enabled to be tested with a single test apparatus. Also, a device having both a low-speed section having a response frequency on the order of kHz and a high-speed section having a response frequency on the order of GHz is enabled to be tested.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

By way of an example, the test apparatus 100 may be provided as a test circuit formed on the same electronic device as a circuit under test is formed to be tested. The test circuit is implemented as a BIST circuit or the like for the electronic device in order to be used to perform diagnostics and the like for the electronic device by testing the circuit under test. Accordingly, the test circuit males it possible to check whether the circuit under test can achieve normal operations or functions according to the intended purpose as the electronic device.

Also, the test apparatus 100 may be provided as a test circuit formed on the same board or in the same device as a circuit under test is formed to be tested. Such test circuit also makes it possible to check whether the circuit under test can achieve normal operations or functions according to the intended purpose.

Although the range modification section 144 has been exemplified by the ten-bit shifter 304 in the above-described embodiments, the range modification section 144 may also be provided as a multiplier and the like for multiplying the timing data T_DATA by a factor based on the setting range in order to generate the delay data D_DATA.

The above-described embodiments have exemplified the cases that the timing data T_DATA has twenty bits, that the delay data D_DATA has thirty bits, or that the bit shift amount of the ten-bit shifter 304 is ten bits. However, these bit numbers are not limited to such exemplified numbers or values. Any bit number or bit shift amount can be applied.

In the above-described embodiments, the band selection signal BAND_SEL has been exemplified by the case of one-bit logic value H or L, i.e., the case that the selectable band is limited to one when a bit shift is performed, or the case that the band number is limited to two including one when no bit shift is performed. However, the selectable band number may be plural. For example, it is possible to select two or more bands where the case of no bit shift, the case of five-bit shift and the case of ten-bit sift are regarded respectively as a band zero, a band one and a band two.

The above-described embodiments have exemplified the case that the fine delay circuit 310 is not operable when the band selection signal BAND_SEL lies in the logic value H, i.e., the case that zero is inputted to every bit in the lower field LOWER_FIELD of the delay data D_DATA. However, eight bits and the like may be allocated as the bit shift amount of the timing data T_DATA, while the remaining two bits may be allocated to the lower field LOWER_FIELD of the delay data D_DATA. In this case, the remaining two-bit data in the lower field LOWER_FIELD affect the process for calculating the fine delay time in the fine delay circuit 310.

As another example, the band selection may be performed at every input/output terminal of the DUT 200. As yet another example, the band selection, signal BAND_SEL may be set for every test period or test cycle so as to switch the band. As still yet another example, the bands may be switched among each other at any timing within the test period.

The above-described embodiments have exemplified the case that the timing data T_DATA are designated by the timing memory 302. However, the timing data T_DATA are not necessarily loaded from the timing memory 302. For example, the timing data T_DATA may be calculated from the timing information.

As clearly indicated by the above description, an embodiment of the present invention can easily achieve a test apparatus and an electronic device enabling low-speed and high-speed devices to be tested with a single test apparatus. Also, an embodiment of the present invention can easily achieve a test apparatus and an electronic device enabling a device having both low-speed and high-speed sections to be tested.

What is claimed is:

1. A test apparatus for testing a device under test, the test apparatus comprising:
    a timing data output section for outputting timing data to define at least one of a timing of modifying a test signal provided to the device under test and a timing of acquiring an output signal outputted by the device under test;
    a variable delay circuit for delaying a reference clock pulse of the test apparatus by a delay amount corresponding to designated delay data so as to generate a timing signal having a transition point corresponding to the at least one timing; and
    a range modification section for modifying a modification amount of the delay data when the timing data are changed by one unit in response to a change of a setting range within which the at least one timing is set,
    wherein the range modification section is operable to output the delay data, which are obtained by multiplying the timing data with a predetermined multiple corresponding to the setting range, to the variable delay circuit.

2. The test apparatus as set forth in claim 1, further comprising a period generator for defining a period of a test cycle at every test cycle of testing the device under test, wherein
    the timing data output section is operable to modify the setting range based on the period of the test cycle.

3. The test apparatus as set forth in claim 1, further comprising a pattern generator for outputting at least one pattern data of a test pattern to be provided to the device under test during the test cycle and an expected value pattern of the output signal from the device under test during the test cycle, at every test cycle of testing the device under test, wherein
    the timing data output section is operable to define the modification amount of the delay data when the timing data are changed by one unit based on the setting range designation data included as a part of the pattern data.

4. A test apparatus for testing a device under test, the test apparatus comprising:
    a timing data output section for outputting timing data to define at least one of a timing of modifying a test signal provided to the device under test and a timing of acquiring an output signal outputted by the device under test;
    a variable delay circuit for delaying a reference clock pulse of the test apparatus by a delay amount corresponding to designated delay data so as to generate a timing signal having a transition point corresponding to the at least one timing, the variable delay circuit comprises:
        a coarse delay circuit for generating a coarse delay signal obtained by allowing the reference clock pulse delayed by an integer multiple of the reference clock based on an upper field value of the delay data; and
        a fine delay circuit for generating the timing signal obtained by allowing the coarse delay signal delayed by a predetermined delay amount smaller than the reference clock period based on an lower field value of the delay data; and
    a range modification section for modifying a modification amount of the delay data when the timing data are changed by one unit in response to a change of a setting range within which the at least one timing is set,
    wherein
        the range modification section is operable to output the delay data, which are obtained by allowing the timing data to be shifted by a predetermined bit number corresponding to the setting range, to the variable delay circuit, and
        the range modification section is operable to set the timing data as the delay data based on a designation of a first selling range, while to set as the delay data a value obtained by shifting the timing data upward by a predetermined bit number based on a designation of a second setting range that is configured to be broader than the first setting range.

5. The test apparatus as set forth in claim 4, wherein the range modification section is operable to set the upper field value of the delay data as the timing data value, while to set the lower field value of the delay data as zero, based on the designation of the second setting range.

6. An electronic device comprising:
a test circuit; and
a circuit under test to be tested,
wherein
  the test circuit comprises:
    a timing data output section for outputting timing data to define at least one of a timing of modifying a test signal provided to the circuit under test and a timing of acquiring an output signal outputted by the circuit under test;
    a variable delay circuit for delaying a reference clock pulse of the electronic device by a delay amount corresponding to designated delay data so as to generate a timing signal having a transition point corresponding to the at least one timing; and
    a range modification section for modifying the modification amount of the delay data when the timing data are changed by one unit in response to a change of a setting range within which the at least one timing is set, and
  the range modification section is operable to output the delay data, which are obtained by multiplying the timing data with a predetermined multiple corresponding to the setting range, to the variable delay circuit.

7. An electronic device comprising:
a test circuit; and
a circuit under test to be tested,
wherein
  the test circuit comprises:
    a timing data output section for outputting timing data to define at least one of a timing of modifying a test signal provided to the circuit under test and a timing of acquiring an output signal outputted by the circuit under test;
    a variable delay circuit for delaying a reference clock pulse of the electronic device by a delay amount corresponding to designated delay data so as to generate a timing signal having a transition point corresponding to the at least one timing, the variable delay circuit comprising:
      a coarse delay circuit for generating a coarse delay signal obtained by allowing the reference clock pulse delayed by an integer multiple of the reference clock based on an upper field value of the delay data; and
      a fine delay circuit for generating the timing signal obtained by allowing the coarse delay signal delayed by a predetermined delay amount smaller than the reference clock period based on an lower field value of the delay data; and
    a range modification section for modifying the modification amount of the delay data when the timing data are changed by one unit in response to a change of a setting range within which the at least one timing is set,
  the range modification section is operable to output the delay data, which are obtained by allowing the timing data to be shifted by a predetermined bit number corresponding to the setting range, to the variable delay circuit, and
  the range modification section is operable to set the timing data as the delay data based on a designation of a first setting range, while to set as the delay data a value obtained by shifting the timing data upward by a predetermined bit number based on a designation of a second setting range that is configured to be broader than the first setting range.

* * * * *